United States Patent
Caligiore et al.

(10) Patent No.: US 8,853,800 B2
(45) Date of Patent: Oct. 7, 2014

(54) INTEGRATED DEVICE OF THE TYPE COMPRISING AT LEAST A MICROFLUIDIC SYSTEM AND FURTHER CIRCUITRY AND CORRESPONDING INTEGRATION PROCESS

(75) Inventors: Claudia Caligiore, Giarre (IT); Salvatore Leonardi, Aci S. Antonio (IT); Salvatore Baglio, San Giovanni La Punta (IT); Bruno Ando', Aci Catena (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 329 days.

(21) Appl. No.: 13/178,076

(22) Filed: Jul. 7, 2011

(65) Prior Publication Data
US 2012/0007150 A1    Jan. 12, 2012

(30) Foreign Application Priority Data

Jul. 7, 2010 (IT) .............................. MI2010A1258

(51) Int. Cl.
*H01L 29/84*    (2006.01)
*B81C 1/00*    (2006.01)

(52) U.S. Cl.
CPC ....... *B81C 1/00246* (2013.01); *B81B 2201/032* (2013.01); *B81B 2203/0338* (2013.01); *B81B 2201/058* (2013.01)
USPC ........... 257/415; 257/416; 257/417; 257/418; 257/419

(58) Field of Classification Search
CPC .................................................. B81C 1/00261
USPC .................................. 257/415–419, 294, 254
See application file for complete search history.

(56) References Cited

U.S. PATENT DOCUMENTS

| | | | |
|---|---|---|---|
| 5,631,428 | A | 5/1997 | Catanescu et al. |
| 6,888,213 | B2 | 5/2005 | Leonardi et al. |
| 2003/0116813 | A1 | 6/2003 | Benzel et al. |

FOREIGN PATENT DOCUMENTS

EP    0890998    1/1999

OTHER PUBLICATIONS

Search Report for Italian Application No. MI20101258, Ministero dello Sviluppo Economico, Berlin, May 11, 2011, pp. 2.

*Primary Examiner* — Tran Tran
(74) *Attorney, Agent, or Firm* — Graybeal Jackson LLP

(57) ABSTRACT

An embodiment relates to a device integrated on a semiconductor substrate of a type comprising at least one first portion for the integration of at least one microfluidic system, and a second portion for the integration of an additional circuitry. The microfluidic system comprises at least one cavity realized in a containment layer of the integrated device closed on top by at least one portion of a polysilicon layer, this polysilicon layer being a thin layer shared by the additional circuitry and the closing portion of the cavity realizing a piezoresistive membrane for the microfluidic system.

46 Claims, 6 Drawing Sheets

INTEGRATED DEVICE OF THE TYPE COMPRISING AT LEAST A MICROFLUIDIC SYSTEM AND FURTHER CIRCUITRY AND CORRESPONDING INTEGRATION PROCESS

PRIORITY CLAIM

The instant application claims priority to Italian Patent Application No. MI2010A001258, filed Jul. 7, 2010, which application is incorporated herein by reference in its entirety.

TECHNICAL FIELD

An embodiment relates to a device integrated on a semiconductor substrate.

More specifically, an embodiment relates to an integrated device of the type comprising at least one first portion for the integration of at least one microfluidic system, and at least one second portion for the integration of an additional circuitry.

An embodiment also relates to a process of integration of such a device.

BACKGROUND

As it is well known, the need of realizing sensor devices of various types is always increasing, such as pressure sensors, temperature sensors, sensors for measuring the PH, magnetic sensors, sensors sensitive to the field of the infrared radiations or IR, and other sensors, to be used in different fields, such as in the field of microfluidics, of microelectronics, of mechanics, the sizes of these sensor devices becoming smaller and smaller.

It is also known to realize miniaturized sensors by using an advanced technology of micromachining, for obtaining integrated microsensors and microactuators together with standard circuitry. Devices realized with this technology are commonly indicated as MEMS (acronym of "Micro Electro-Mechanical System" i.e. miniaturized electro-mechanical system), they have reduced size, and are usually low cost, i.e. they are realized respecting the so-called low-cost targets.

Moreover, a MEMS device may be manufactured on a semiconductor substrate simultaneously with additional circuitry, like signal processing circuitry (signal processing), thus obtaining a single device that also has a limited distance between sensor and circuitry, thus strongly increasing the reliability of the processed signal.

A MEMS device thus realized so as to comprise a sensor and related circuitry realized on a same substrate has a high-sensing sensitivity together with a low-realization cost, which makes its realization and use attractive.

Although it may be advantageous in several aspects, this known technique may have a drawback in that it may require the application of micromachining techniques after the realization of the integrated circuitry, with a potentially unavoidable increase in the number of process steps, and, in consequence, an increase in the cost of the final device comprising the sensor and the related circuitry.

SUMMARY

An embodiment is a device integrated on a semiconductor substrate of the type comprising at least one microfluidic system and additional circuitry, having such structural and functional characteristics so as not require the usual micromachining techniques, thus overcoming one or more of the limitations and the drawbacks that may still affect conventional devices.

An embodiment is a method for creating at least one cavity in a containment layer, in particular a semiconductor or insulating layer, suitable for realizing a microfluidic system, thus obtaining, with a single integration process, an integrated device comprising such a microfluidic system in a first portion and additional circuitry in a second circuitry portion.

An embodiment of the integration process is of the thin-film type and provides at least one thin polysilicon layer suitable for realizing a cover for this cavity, and thus a piezoresistive membrane of the related microfluidic system, obtaining de facto a new low-cost, versatile integration technology for integrated devices comprising at least one microfluidic system and additional integrated, thin-film circuitry.

An embodiment is a device integrated on a semiconductor substrate of the type comprising at least one first portion for the integration of at least one microfluidic system, and a second portion for the integration of additional circuitry, wherein said microfluidic system comprises at least one cavity realized in a containment layer of said integrated device and closed on top by at least one portion of a polysilicon layer, said polysilicon layer being a thin layer shared by said additional circuitry, said closing portion of said cavity forming a piezoresistive membrane for said microfluidic system.

More in particular, one or more embodiments comprise the following supplementary and optional characteristics, taken singularly or, if need be, in combination.

According to an embodiment, the integrated device may further comprise a contact, realized in correspondence with at least one active area, realized in said thin polysilicon layer in said first portion, said first contact being suitable for controlling said cover portion of said cavity as a piezoresistive membrane of said microfluidic system.

In particular, according to an embodiment, said additional circuitry may be realized by means of thin film technology and comprises said thin polysilicon layer.

Moreover, according to an embodiment, said additional circuitry may comprise at least one thin film transistor including at least one circuitry active area realized in a second portion of said thin polysilicon layer in correspondence with said second portion and contacted by means of a first circuitry contact, while a second circuitry contact is realized in correspondence with a non active area of said second portion, said first circuitry contact being a source/drain contact and said second circuitry contact being a gate contact of said thin film transistor.

Furthermore according to an embodiment, said cavity may be realized in a first oxide layer realized above said semiconductor substrate.

According to an embodiment, said first oxide layer may comprise at least one portion with greater thickness with respect to the rest of the layer and said cavity may be realized in said portion of greater thickness.

Furthermore, according to an embodiment, said first oxide layer may have a step in correspondence with said portion of greater thickness, in a superelevated position with respect to an upper surface level of said second circuitry portion.

According to another embodiment, said first oxide layer may have a lowered portion in correspondence with said first portion for realizing said portion of greater thickness.

Moreover, according to an embodiment, said cavity is realized in said semiconductor substrate and is closed on top by a first oxide layer.

In particular, according to an embodiment, the integrated device may comprise at least one first, one second and one third portion of said thin polysilicon layer realized above said first oxide layer in correspondence with said cavity and separated from each other by at least one first and one second opening for realizing a piezoresistive membrane equipped with microfluidic openings for said microfluidic system.

Furthermore, according to an embodiment, said cavity may comprise a trench structure.

According to an embodiment, said trench structure may comprise a covering oxide layer that covers side walls and a bottom of said trench.

According to an embodiment, the integrated device may further comprise a second oxide layer realized above said thin polysilicon layer and said first oxide layer on said whole integrated device.

According to another embodiment, the integrated device may further comprise, above said semiconductor substrate and below said first oxide layer, a silicon layer.

In particular, according to an embodiment, said silicon layer may extend at least in correspondence with said first portion.

According to an embodiment, said silicon layer may extend above said semiconductor substrate in correspondence with said first portion and with said second portion, the silicon layer being a heavily doped silicon According to another embodiment, the integrated device may comprise a substrate contact.

In particular, according to an embodiment, said substrate contact may be realized in correspondence with a suitable opening in contact with said silicon layer.

According to an embodiment, said substrate contact may be realized on the back of the device itself, directly in contact with said semiconductor substrate.

Furthermore, according to an embodiment, said microfluidic system may realize one among a sensor, a tank for fluids, and a microchannel for fluids.

An embodiment is a process of integration on a semiconductor substrate of at least one integrated device of the type comprising at least one first portion for the integration of at least one microfluidic system, and a second portion for the integration of additional circuitry, the process comprising the steps of:
realizing said semiconductor substrate;
depositing a first oxide layer on said semiconductor substrate; and
realizing at least one opening by means of a first etching step of said first oxide layer;
wherein it further comprises the steps of:
realizing at least one trench structure by means of a second etching step of said semiconductor substrate through said opening for creating at least one cavity; and
depositing a polysilicon layer having at least one first portion in correspondence with said trench structure so as to realize at least one microfluidic system equipped with a cavity closed by said first portion of said polysilicon layer as a piezoresistive membrane for said microfluidic system
said process being a thin film process comprising a step of depositing said polysilicon layer as a thin layer shared by said microfluidic system and said additional circuitry.

According to an embodiment, the integration process may further comprise a step of oxidizing walls and a bottom of said trench with creation of a covering oxide layer.

In particular, according to an embodiment, the integration process may further comprise a step of:
etching said thin polysilicon layer for defining said first portion in correspondence with said trench and a second portion in correspondence with said second portion for the integration of additional circuitry.

According to an embodiment, the integration process may further comprise the steps of:
depositing a second oxide layer above the whole integrated structure, in particular above said first and second portion of said thin polysilicon layer and of said first oxide layer; and
realizing in said first and second portion of said thin polysilicon layer at least one active area in correspondence with said first portion for the integration of at least one microfluidic system and a circuitry active area in correspondence with said second portion for the integration of additional circuitry, by means of implantation of suitable dopant through said second oxide layer.

According to an embodiment, the integration process may further comprise a laser crystallization step.

Moreover, according to an embodiment, the integration process may further comprise the steps of:
realizing at least one first contact opening in said second oxide layer until reaching said active area and a second contact opening in said second oxide layer until reaching said circuitry active area; and
realizing a contact in correspondence with said active area, a circuitry contact in correspondence with said circuitry active area and a substrate contact on the back of the device itself, in contact with said semiconductor substrate.

Finally, according to an embodiment, the integration process may further comprise a step of metalizing said contacts.

BRIEF DESCRIPTION OF THE DRAWINGS

Characteristics and advantages of one or more embodiments of an integrated device and of an integration process will be apparent from the following description, which is given by way of indicative and non limiting example with reference to the annexed drawings.

In these drawings.

DETAILED DESCRIPTION

Figure 1:
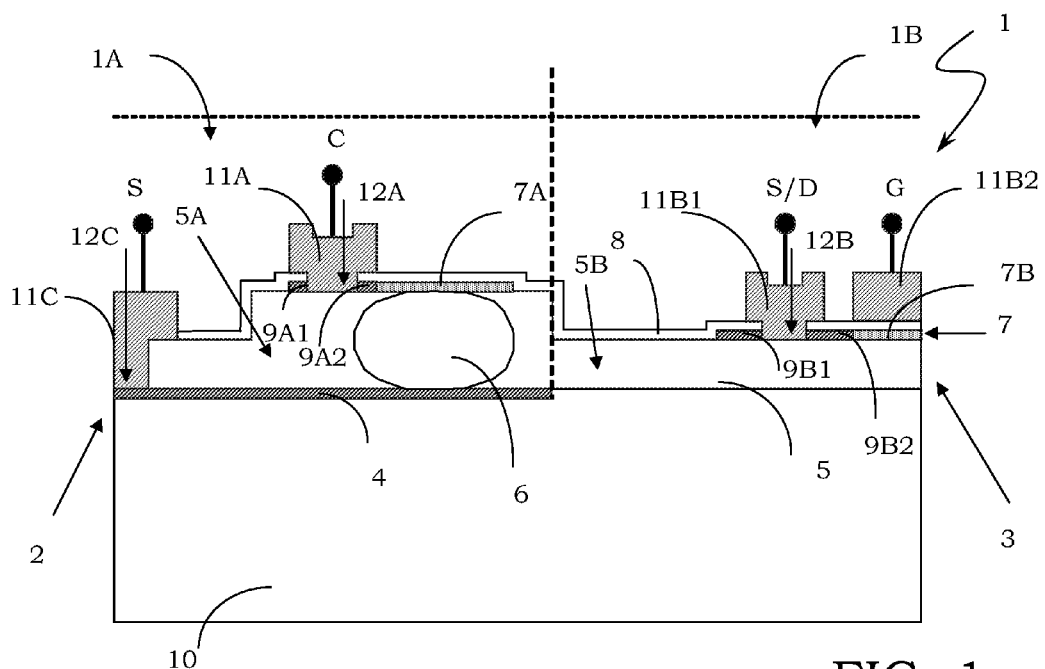
FIGS. 1 to 4 schematically show embodiments of an integrated device comprising at least one microfluidic system and additional circuitry.

With reference to these figures, and in particular to FIG. 1, 1 globally and schematically indicates an integrated device according to an embodiment.

It is to be noted that the figures showing schematic views of the integrated device 1 are may not be drawn to scale, but are instead drawn so as to emphasize certain characteristics of the device. Moreover, in the figures, the different pieces are represented in a schematic way, their shapes having the possibility to vary according to the desired application.

The integrated device 1 comprises, according to an embodiment, at least one first portion 1A for the integration of at least one microfluidic system 2, and a second portion 1B for the integration of additional circuitry 3. As it will be clarified hereafter in the description, the microfluidic system 2 realizes a sensor or a tank for fluids, or even channels for fluids.

More in particular, in the first portion 1A a microfluidic system is realized, in particular a pressure sensor in an embodiment, while in the second portion 1B at least one MOS transistor with thin film or TFT (acronym of "Thin Film Transistor") is realized.

As it will be seen hereafter in the description, according to an embodiment, the integrated device 1 is realized by using a thin film technology, that, suitably modified, allows integrating on a same chip a region dedicated to the microfluidics or sensor technique and a region dedicated to the part of electric conditioning, with attainment of a new low cost technological platform on a conventional substrate.

More in detail, with reference to a first embodiment shown in FIG. 1, the integrated device 1 comprises the first portion 1A for the integration of the microfluidic system 2, and the second portion 1B for the integration of the circuitry 3, realized over a same semiconductor substrate 10, in particular of monocrystalline silicon.

The first portion 1A, and in particular the microfluidic system 2, comprises at least one cavity 6, realized in a containment layer, in particular semiconductor or insulating, respectively silicon or silicon oxide, and in contact with at least one portion of a thin layer, in particular of polysilicon, that realizes a covering piezoresistive membrane, as it will be clarified hereafter.

More in detail, on the semiconductor substrate 10 at least one silicon layer 4, at least in correspondence with the first portion 1A, and a first oxide layer 5 as well as the cavity 6 of the microfluidic system 2 are realized. Above the first oxide layer 5 a polysilicon layer 7 is also realized, a first portion of which covers at least in part the cavity 6, whereas the silicon layer being a heavily doped silicon layer having concentration higher than $10^{18}$ at/cm$^3$ More in detail, making reference to the embodiment of FIG. 1, the cavity 6 is realized in the first oxide layer 5 in the first portion 1A, above the silicon layer 4, that, in this case, extends only in correspondence with this first portion 1A. Moreover, the polysilicon layer 7 comprises a first portion 7A that totally covers the cavity 6.

In this way, the cavity 6 of the microfluidic system 2 is surrounded on its sides by the oxide of the first oxide layer 5 and delimited below by the silicon of the silicon layer 4 and on top by the polysilicon of the polysilicon layer 7.

The first oxide layer 5 has a greater thickness in the first portion 1A with respect to the second portion 1B, so as to house correctly the cavity 6 of the microfluidic system 2. In particular, in an embodiment of FIG. 1, the first oxide layer 5 has a step in correspondence with the first portion 1A, and more in particular with the cavity 6 of the microfluidic system 2, in a superelevated position with respect with an upper surface level of the second portion 1B of circuitry. In this way, the first oxide layer 5 has a first portion 5A of greater thickness in which the cavity 6 of the microfluidic system 2 is realized and a second portion 5B of smaller thickness in which the circuitry 3 is realized, in particular a transistor TFT.

The words "upper", "lower", "above", "below" and the like are to be intended in a sense of development of the integrated device 1 starting from the semiconductor substrate 10.

The polysilicon layer 7 also has a second portion 7B in correspondence with the second portion 1B of circuitry.

Furthermore, in the polysilicon layer 7 active areas are realized, in particular through doping. In this way, according to an embodiment of FIG. 1, the integrated device 1 comprises at least one first and one second active area, in particular the areas 9A1 and 9A2 realized in the first portion 7A of the polysilicon layer 7 in correspondence with the microfluidic system 2, as well as at least one first and one second circuitry active area, in particular the areas 9B1 and 9B2 realized in the second portion 7B of the polysilicon layer 7 in correspondence with the circuitry 3.

The integrated device 1 also comprises a second oxide layer 8 realized above the polysilicon layer 7 and the first oxide layer 5 on the whole integrated device 1.

In correspondence with a first contact opening 12A, realized in the second oxide layer 8 and in the first portion 7A of the polysilicon layer 7 between the active areas 9A1 and 9A2, the integrated device 1 comprises a contact 11A of the microfluidic system that may be realized in particular in polysilicon, suitably metalized on top.

Furthermore, in correspondence with a second contact opening 12B, realized in the second oxide layer 8 and in the second portion 7B of the polysilicon layer 7 between the circuitry active areas 9B1 and 9B2, the integrated device 1 comprises a first circuitry contact 11B1, while a second circuitry contact 11B2 is realized above the second oxide layer 8 in correspondence with the non doped area of the second portion 7B of the polysilicon layer 7. In particular, the first circuitry contact 11B1 is a source/drain contact, while the second circuitry contact 11B2 is a gate contact of a thin film transistor that constitutes the driving circuitry 3, in a simplified embodiment given by way of indicative and non limiting illustration. Also the first and second circuitry contact, 11B1 and 11B2, may be realized in polysilicon and suitably metalized.

The integrated device 1 also comprises a substrate contact 11C, realized in an embodiment, in correspondence with a third contact opening 12C made in the second oxide layer 8 and in the first oxide layer 5 until contacting the silicon layer 4 of the first portion 1A.

In this way, the active areas 9A1 and 9A2, realized by suitably doped polysilicon regions, may be contacted so as to electrically condition the cavity 6, according to the typology of the microfluidic system and in particular of the sensor to be realized, through the adjacent non doped area of the first portion 7A of the polysilicon layer 7. Thanks to the heavily doped silicon layer 4 the layer resistance and consequently the contact resistance, between the substrate contact 11C and the silicon layer 4, is reduced.

It is noted that the polysilicon layer 7, in particular the first portion 7A bordering on the cavity 6, has very thin thickness since it is the same polysilicon layer with which the circuitry 3 is realized, and in particular the transistor integrated by means of thin film technology. In an embodiment, the thin polysilicon layer 7 has a thickness and one or more other dimensions that are compatible with those of the layers used in thin film technology.

It is also noted that the integrated device 1 thus realized comprises a microfluidic system 2 provided with a cavity 6 wherein, for example, the passage of a fluid may be modulated by the piezoresistive action of the first portion 7A of the polysilicon layer 7, which realizes one or more polysilicon piezoresistive membranes that may be suitably biased thanks to the contact 11A, thus realizing for example sensors, tanks, or microchannels to be used in the field of the microfluidics. Similarly, the integrated device 1 allows realizing an infrared sensor or IR in which air contained inside the cavity 6 is heated in response to infrared radiation being present.

One may use the integrated device 1 for realizing sensors of any type as well as for realizing a microfluidic system using fluids being stationary in tanks or flowing in microchannels.

In its more general form, an embodiment of the integrated device 1 comprises at least one first portion 1A suitable for housing a microfluidic system 2 and a second circuitry portion 1B suitable for housing circuitry 3, in particular a thin film transistor, realized above a semiconductor substrate 10.

The microfluidic system 2 comprises at least one cavity 6 realized in a containment layer, in particular semiconductor or insulating, and closed on top by at least one portion 7A of a thin polysilicon layer 7, the circuitry 3 being realized by using thin film technology. In particular, the portion 7A closing the cavity 6 forms a piezoresistive membrane able to be controlled by at least one contact 11A, realized in correspondence with active areas, 9A1 and 9A2, realized in this portion 7A of the thin polysilicon layer 7.

Figure 2:
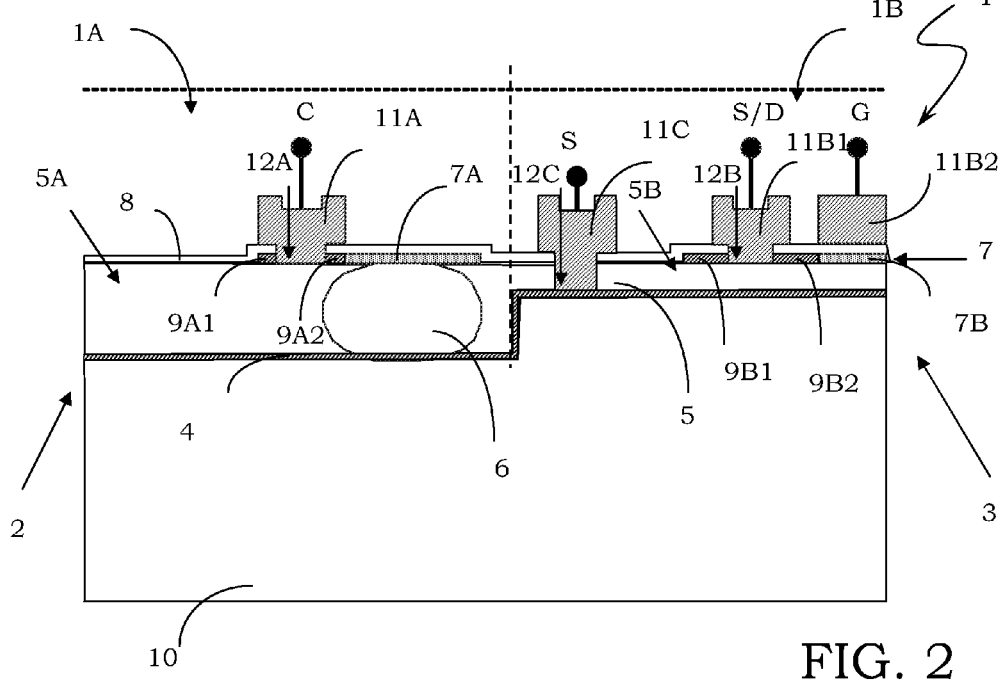

An embodiment of the integrated device 1 comprising the microfluidic system 2 is shown in FIG. 2. For simplicity of illustration, elements and layers being structurally and functionally identical to the embodiment of FIG. 1 will be given the same alphanumeric references.

According to an embodiment, the cavity 6 of the microfluidic system 2 is realized in a lowered portion of the containment layer, in particular in the first oxide layer 5 provided in the first portion 1A.

Also in this case, the cavity 6 is surrounded on its sides by the oxide of the first oxide layer 5 and delimited below by the silicon layer 4 and above by the first portion 7A of the thin polysilicon layer 7, which forms a piezoresistive membrane for the microfluidic system 2.

Furthermore, according to an embodiment, the substrate contact 11C is realized in correspondence with a third contact opening 12C made in the second oxide layer 8 and in the first oxide layer 5 until contacting the silicon layer 4 of the second circuitry portion 1B, this silicon layer 4 extending in this case on the semiconductor substrate 10 in correspondence with both portions 1A and 1B. Making the heavily doped silicon layer 4 the contact resistance, between the substrate contact 11C and the silicon layer 4, is reduced.

It is noted that an embodiment that provides a lowered portion of the containment layer, in particular the first oxide layer 5, allows improving the planarity of the device and may improve its process integration. More in particular, this lowered portion is realized by creating a step in the silicon semiconductor substrate 10 whereon the silicon layer 4 and the first oxide layer 5 are realized, this latter layer thus having a first portion 5A of greater thickness wherein the cavity 6 of the microfluidic system 2 is realized and a second portion 5A of smaller thickness over which the circuitry 3 is realized, in particular a TFT transistor.

Figure 3:
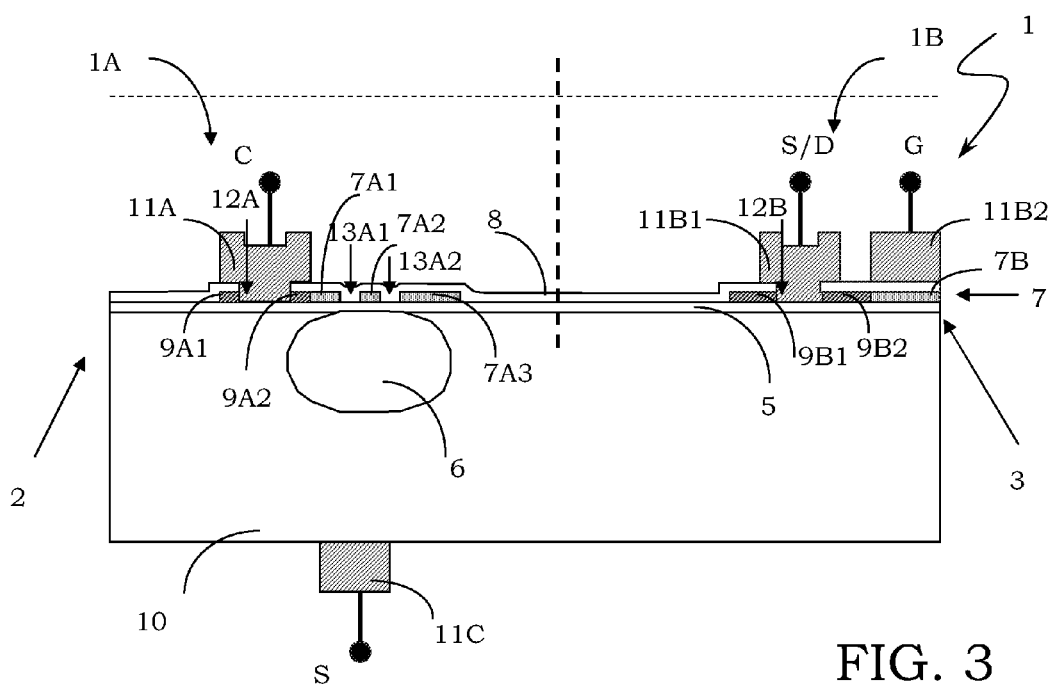

An embodiment of the integrated device 1 comprising the microfluidic system 2 is shown in FIG. 3, elements and layers being structurally and functionally identical to the other embodiments having the same alphanumeric references.

According to an embodiment, the cavity 6 of the microfluidic system 2 is realized in the semiconductor substrate 10, which forms, in this case, the containment layer.

The cavity 6 is in this case completely surrounded by silicon and delimited above by a first, a second and a third portion, respectively 7A1, 7A2 and 7A3, of the thin polysilicon layer 7, separated from each other by a first and a second opening, respectively 13A1 and 13A2, realized in the thin polysilicon layer 7 and filled in by the second oxide layer 8, which together forms a piezoresistive membrane for the microfluidic system 2 provided with microfluidic openings.

In this case, the first oxide layer 5 is a thin layer realized above the semiconductor substrate 10 (and also above the cavity 6) and below the thin polysilicon layer 7.

Furthermore, the integrated device 1 according to an embodiment comprises a substrate contact 11C realized on the back of the device itself, in contact with the semiconductor substrate 10.

According to an embodiment, the integrated device 1 has a better surface planarity and allows realizing the cavity 6 and thus regions dedicated to the microfluidics, for example channels, of greater size, since not tied to the maximum thickness of the first oxide layer 5 that may be obtained by the integration of the integrated device 1, as it occurs for the previous embodiments.

Figure 4:
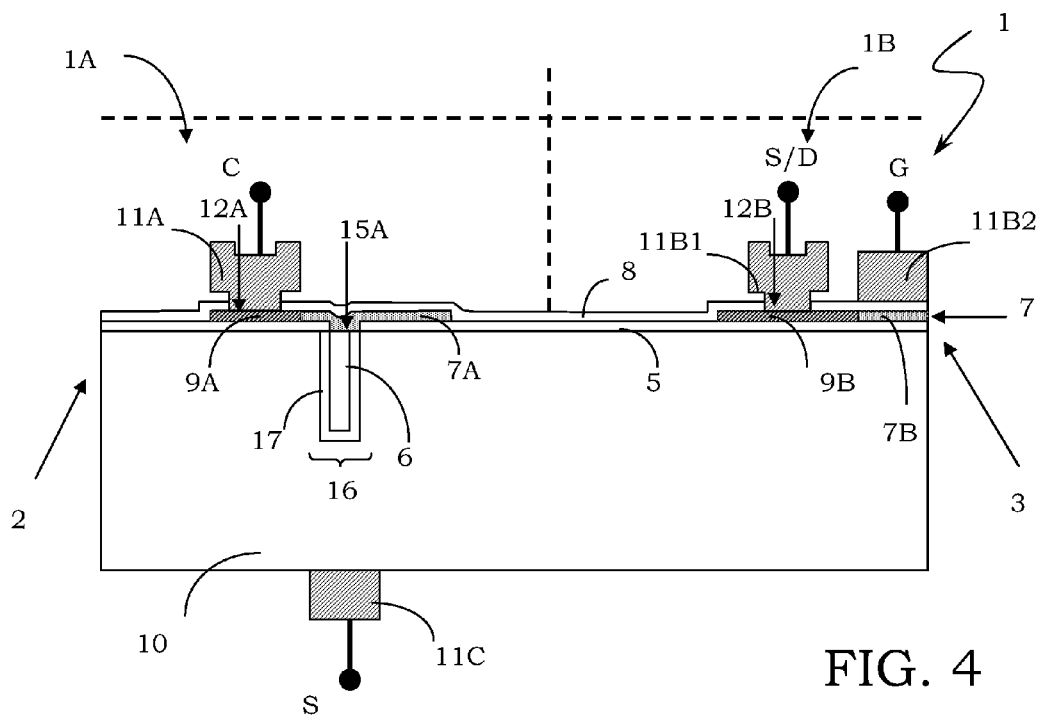

Finally, an embodiment of the integrated device 1 comprising the microfluidic system 2 is shown in FIG. 4, elements and layers being structurally and functionally identical to the other embodiments having the same alphanumeric references.

Also according to an embodiment, the cavity 6 of the microfluidic system 2 is realized in the semiconductor substrate 10, which forms in this case the containment layer.

The cavity 6 is in this case realized by means of a trench structure 16, completely surrounded by silicon and comprising a covering oxide layer 17 that covers the side walls and the bottom of the trench.

According to an embodiment, the integrated device 1 comprises the first oxide layer 5 realized above the semiconductor substrate 10 (and also above the cavity 6) and below the thin polysilicon layer 7. Furthermore, the cavity 6 is covered, in particular in correspondence with the opening 15A of the trench 16, by the first portion 7A of the thin polysilicon layer 7, in turn flanked by a single active area 9A.

In this case, the contact 11A is realized in correspondence with the first contact opening 12A made only in the second oxide layer 8 and in contact with the single active area 9A. Moreover, the circuitry first contact 11B1 is realized in correspondence with the second contact opening 12B, only made in the second oxide layer 8 and in contact with a single circuitry active area 9B. In this way, the trench 16 is realized with a step of dry etching and its desired final dimensions may be better controlled.

Finally, the substrate contact 11C is realized, like for the embodiment above described in conjunction with FIG. 3, on the back of the device itself, in contact with the semiconductor substrate 10.

According to an embodiment, the integrated device 1 has an even better surface planarity and the possibility to realize hollow regions by means of silicon trenches in a conventional manner.

With reference to FIGS. 5A to 5L, an embodiment of an integration process is now described that realizes an integrated device 1 according to an embodiment shown in FIG. 4.

The process steps described hereafter do not form a complete process flow for the manufacturing of integrated circuits. An embodiment may be put into practice together with the manufacturing techniques of the integrated circuits currently used in the field, and only those commonly used process steps that are necessary for the comprehension of an embodiment are included.

Figure 5A:
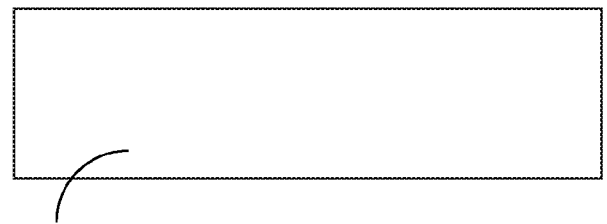
FIGS. 5A to 5L schematically show an embodiment of the device of FIG. 4 in different steps of an integration process according to an embodiment.
Figure 5B:
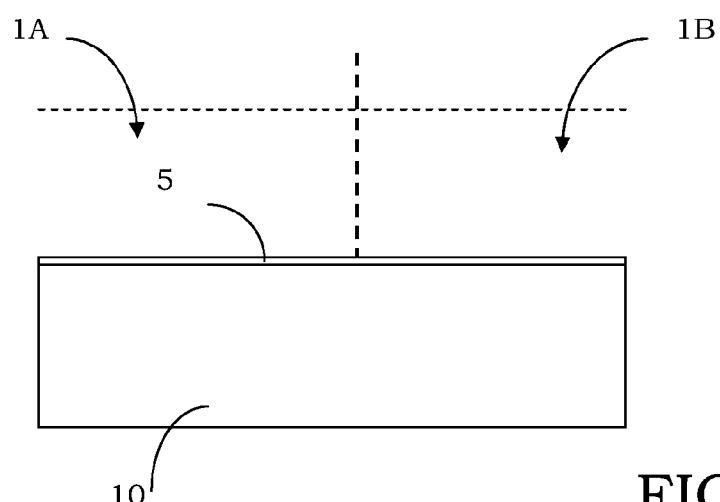
Figure 5C:
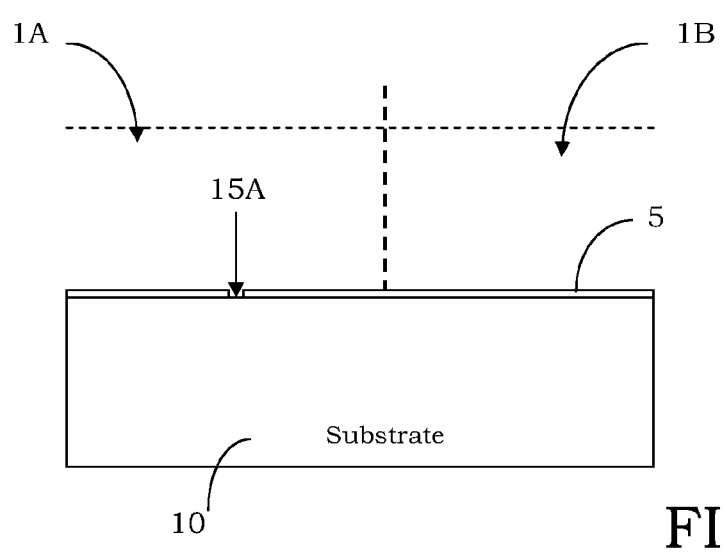

In particular, the integration process according to an embodiment comprises the steps of:
  realizing a semiconductor substrate 10, as shown in FIG. 5A; in particular on this semiconductor substrate 10 reference markers are realized through masking;
  depositing a first oxide layer 5 on the semiconductor substrate 10, as shown in FIG. 5B; and
  realizing an opening 15A by means of a first etching step of the first oxide layer 5, as shown in FIG. 5C.

Figure 5D:
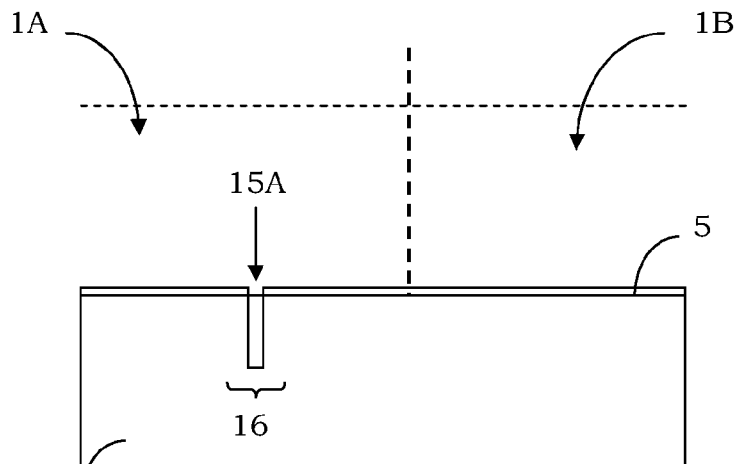
Figure 5E:
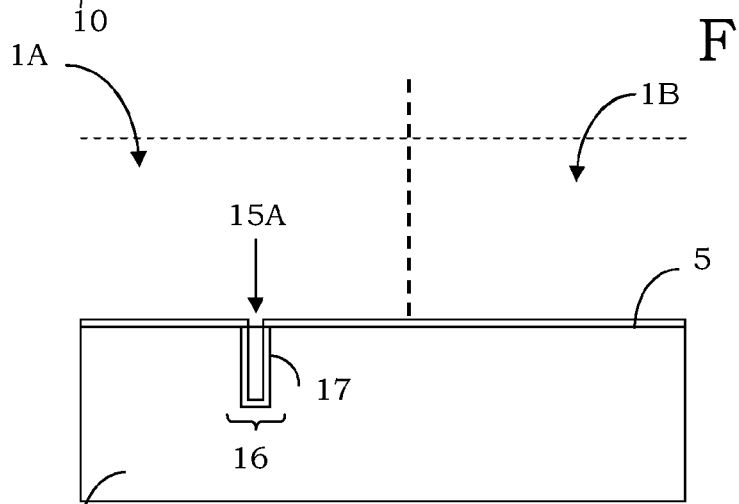
Figure 5F:
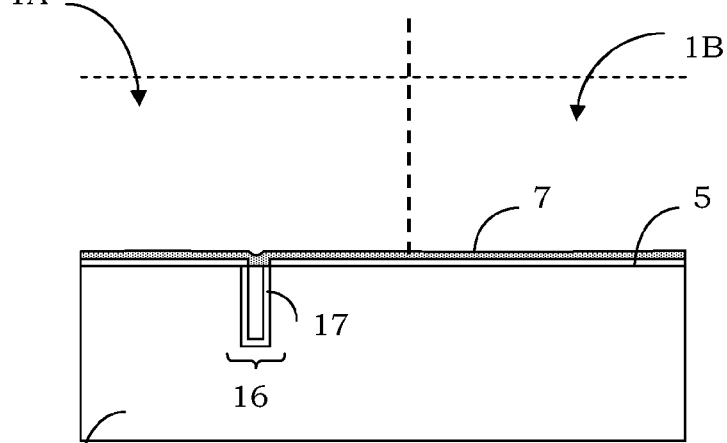

An embodiment of the integration process thus comprises the steps of:
  realizing a trench structure 16 by means of a second etching step of the semiconductor substrate 10 through the opening 15A, as shown in FIG. 5D;
  oxidizing walls and bottom of the trench 16 with creation of a covering oxide layer 17, as shown in FIG. 5E;

depositing the thin polysilicon layer 7, as shown in FIG. 5F.

In particular, then, an integration process according to an embodiment is a thin film process.

In this way, in the semiconductor substrate 10 a cavity 6 is realized formed by the trench 16, this cavity 6 being located in the silicon of the semiconductor substrate 10, surrounded on its bottom and sides by the oxide layer 17 and closed on top by the thin polysilicon layer 7.

Figure 5G:
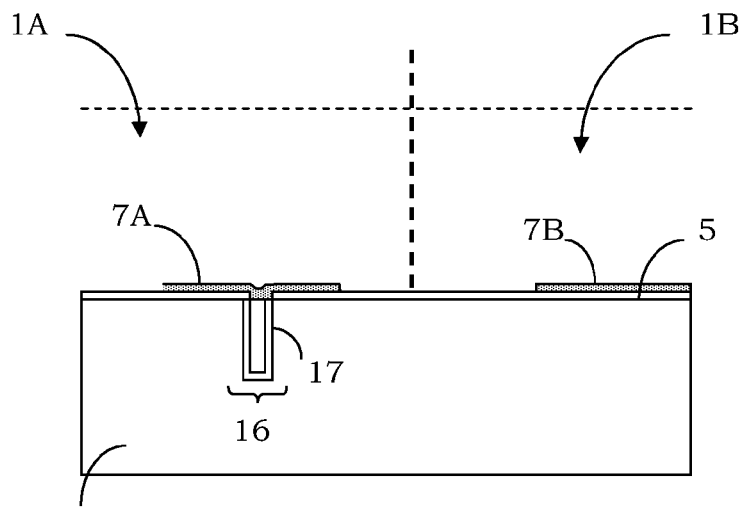
Figure 5H:
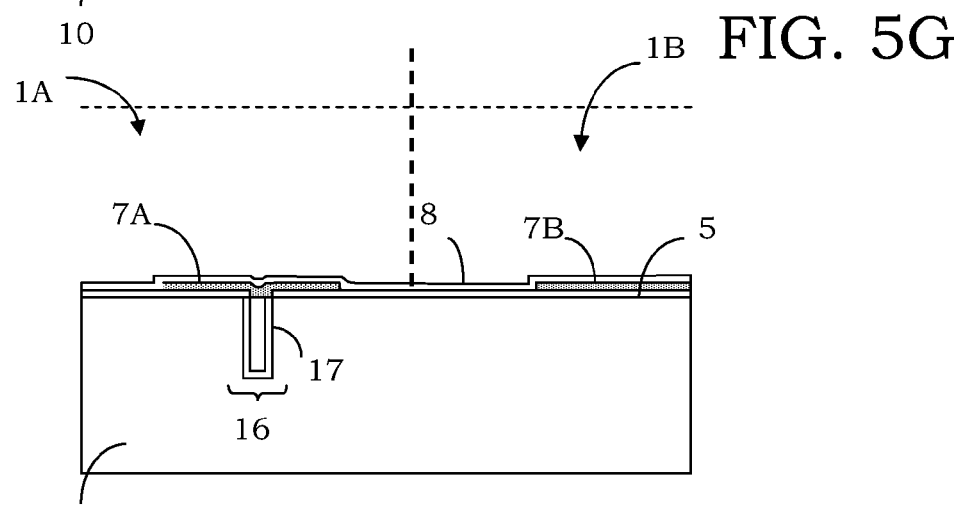
Figure 5I:
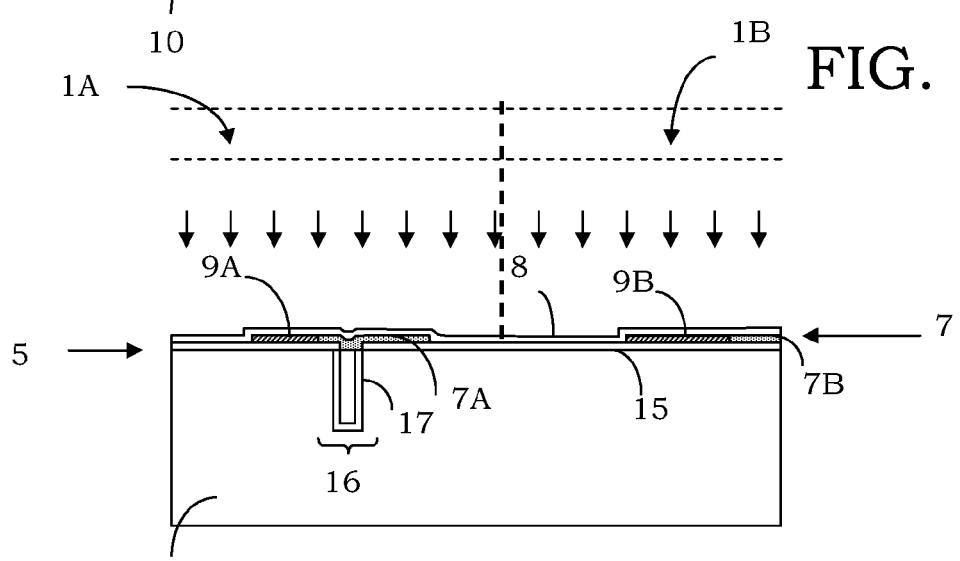

Furthermore, an embodiment of the integration process comprises the steps of:

etching the thin polysilicon layer 7 for defining the first and second portions, 7A and 7B, as shown in FIG. 5G, the first portion 7A being realized in correspondence with the trench 16 in the first portion 1A and the second portion being realized on the first oxide layer 5 in the second circuitry portion 1B;

depositing the second oxide layer 8 above the whole integrated structure, in particular above the portions 7A and 7B of the thin polysilicon layer 7 and of the first oxide layer 5, as shown in FIG. 5H; and realizing in the portions 7A and 7B of the thin polysilicon layer 7 a single active area 9A in the first portion 1A and a single active circuitry area 9B in the second circuitry portion 1B, through implantation of suitable dopant through the second oxide layer 8, as shown in FIG. 5I.

Figure 5J:
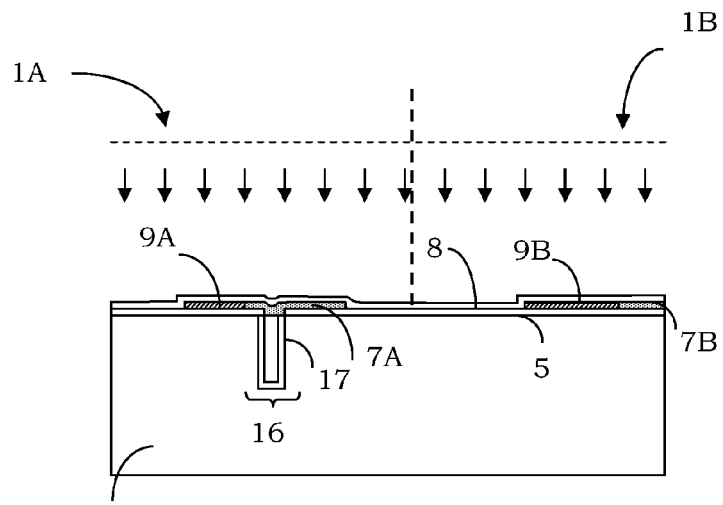
Figure 5K:
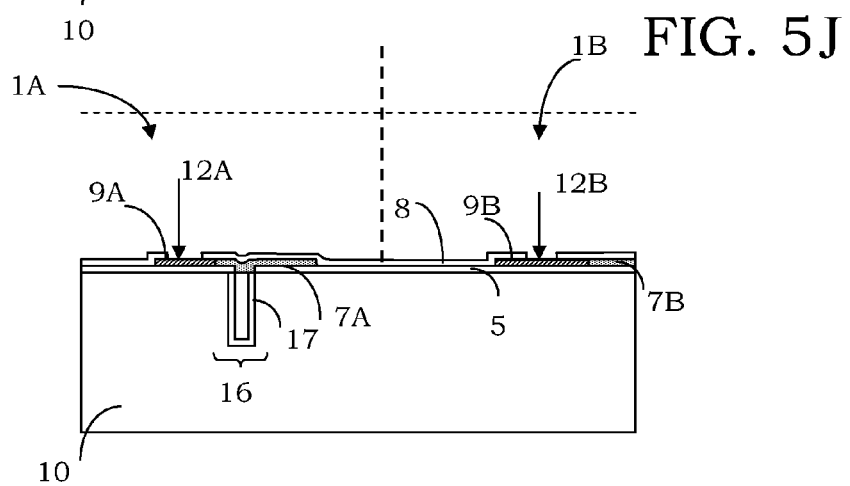
Figure 5L:
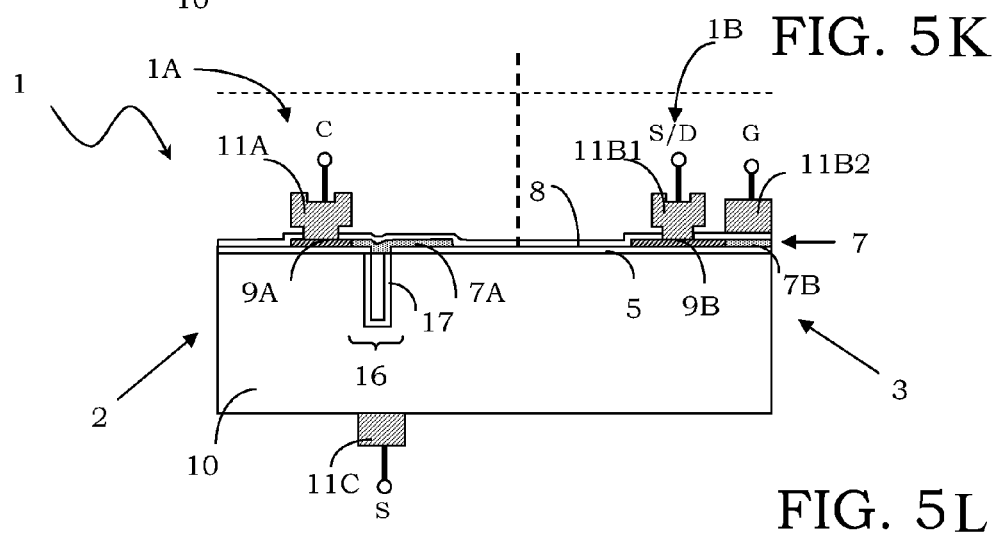

A process according to an embodiment then comprises the steps of:

laser crystallization of the whole integrated structure thus obtained, as shown in FIG. 5J, suitable for passing the amorphous polysilicon layer to a structure that is almost completely crystallized;

realizing at least a first contact opening 12A in the second oxide layer 8 until reaching the single active area 9A in correspondence with the first portion 1A and a second contact opening 12B in the second oxide layer 8 until reaching the single active circuitry area 9B in correspondence with the second circuitry portion 1B, as shown in FIG. 5K; and realizing a contact 11A in correspondence with the single active area 9A of the first portion 1A, circuitry contacts 11B1 and 11B2 in correspondence with the single active circuitry area 9B and the polysilicon layer 7B of the second circuitry portion 1B, a substrate contact 11C on the back of the device itself, in contact with the semiconductor substrate 10, as shown in FIG. 5L.

The process is completed by a step of metallization of the contacts 11A, 11B1, 11B2, and 11C, obtaining in this way the integrated device 1 according to an embodiment also shown in FIG. 4.

It may also be possible to realize the cavity 6 of the microfluidic system 2 according to other known techniques, such as those described in the U.S. Pat. No. 6,888,213 granted on May 3, 2005 to Leonardi et al and which is incorporated by reference.

It is highlighted that, advantageously according to an embodiment, the creation of a cavity in a silicon substrate or in a silicon oxide layer, for realizing the cavity 6 of the microfluidic system 2, coupled to the thin film integration technology that realizes the circuitry 3, allows obtaining de facto a new technology of integration of integrated devices comprising at least one microfluidic system and one additional low cost circuit able to realize integrated devices that serve different functions, such as for example in the field of the sensors.

Referring to FIGS. 1-4, an embodiment of the integrated device 1 may form part of a system that includes another integrated device or circuit coupled to the integrated device 1. The integrated devices/circuits may be disposed on a same die or on respective dies, and at least one of the integrated devices/circuits may be a controller such as a processor. Examples of such a system include a fluid analyzer such as a breathalyzer, and a cooling system for, e.g., a computer.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An integrated device, comprising:
a semiconductor substrate having at least one first portion of at least one microfluidic system, and a second portion for the integration of an additional circuitry;
wherein said microfluidic system includes at least one cavity realized in a containment layer of said integrated device and closed on top by at least one portion of a polysilicon layer, said polysilicon layer being a thin layer that is also disposed over said additional circuitry, said closing portion of said cavity realizing a piezoresistive membrane for said microfluidic system.

2. Integrated device according to claim 1, further comprising a contact, realized in correspondence with at least one active area, realized in said thin polysilicon layer in said first portion, said contact being suitable for controlling said covering portion of said cavity as piezoresistive membranes of said microfluidic system.

3. Integrated device according to claim 2, wherein said additional circuitry is realized by means of thin film technology and comprises said thin polysilicon layer.

4. Integrated device according to claim 3, wherein said additional circuitry comprises at least one thin film transistor including at least one circuitry active area realized in a second portion of said thin polysilicon layer in correspondence with said second portion and contacted by means of a first circuitry contact, while a second circuitry contact is realized in correspondence with a non active area of said second portion, said first circuitry contact being a source/drain contact and said second circuitry contact being a gate contact of said thin film transistor.

5. Integrated device according to claim 3, wherein said cavity is realized in a first oxide layer realized above said semiconductor substrate.

6. Integrated device according to claim 5, wherein said first oxide layer comprises at least one portion of greater thickness with respect to the rest of the layer and in that said cavity is realized in said portion of greater thickness.

7. Integrated device according to claim 6, wherein said first oxide layer has a step in correspondence with said portion of greater thickness, in superelevated position with respect to an upper surface level of said second circuitry portion.

8. Integrated device according to claim 6, wherein said first oxide layer has a lowered portion in correspondence with said first portion for realizing said portion of greater thickness.

9. Integrated device according to claim 3, wherein said cavity is realized in said semiconductor substrate and is closed on top by a first oxide layer.

10. Integrated device according to claim 9, further comprising at least one first, one second and one third portion of said thin polysilicon layer realized above said first oxide layer in correspondence with said cavity and separated from each other by at least one first and one second opening for realizing a piezoresistive membrane provided with microfluidic openings for said microfluidic system.

11. Integrated device according to claim 9, wherein said cavity comprises a trench structure.

12. Integrated device according to claim 11, wherein said trench structure comprises a covering oxide layer that covers side walls and a bottom of said trench.

13. Integrated device according to claim 5, further comprising a second oxide layer realized above said thin polysilicon layer and above said first oxide layer on the whole integrated device.

14. Integrated device according to claim 13, further comprising, above said semiconductor substrate and below said first oxide layer, a doped silicon layer.

15. Integrated device according to claim 14, wherein said doped silicon layer extends at least in correspondence with said first portion.

16. Integrated device according to claim 14, wherein said doped silicon layer extends above said semiconductor substrate in correspondence with said first portion and with said second portion.

17. Integrated device according to claim 14, further comprising a substrate contact.

18. Integrated device according to claim 17, wherein said substrate contact is realized in correspondence with a suitable opening in contact with said doped silicon layer.

19. Integrated device according to claim 17, wherein said substrate contact is realized on the back of the device itself, directly in contact with said semiconductor substrate.

20. Integrated device according to claim 1, wherein said microfluidic system realizes one among a sensor, a tank for fluids, and a microchannel for fluids.

21. An apparatus, comprising:
a semiconductor;
a first section of the semiconductor including,
a cavity having an opening, and
a first piezo-resistive semiconductor layer disposed over the opening; and
a second section of the semiconductor including
a second semiconductor layer, and
a circuit component disposed in the second semiconductor layer.

22. The apparatus of claim 21 wherein the first and second semiconductor layers form respective portions of a same semiconductor layer.

23. The apparatus of claim 21 wherein:
the first section includes an insulator layer; and
the cavity is disposed in the insulator layer.

24. The apparatus of claim 21 wherein:
the second section includes an insulator layer; and
the circuit component is disposed over the insulator layer.

25. The apparatus of claim 21 wherein:
the first section includes a first insulator layer;
the cavity is disposed in the first insulator layer;
the second section includes a second insulator layer; and
the circuit component is disposed over the second insulator layer.

26. The apparatus of claim 25 wherein the first and second insulator layers form respective portions of a same insulator layer.

27. The apparatus of claim 25, further comprising:
a substrate having a surface;
wherein the first and second insulator layers are disposed over the surface of the substrate; and
wherein the first insulator layer extends a higher above the surface of substrate than the second insulator layer extends.

28. The apparatus of claim 25, further comprising:
a substrate having a first surface at a first level and a second surface at a second level; and
wherein the first and second insulator layers are respectively disposed over the first and second surfaces of the substrate.

29. The apparatus of claim 28 wherein the first level is lower than the second level.

30. The apparatus of claim 28 wherein the first level is higher than the second level.

31. The apparatus of claim 25, further comprising:
a substrate having a surface;
wherein the first and second insulator layers are disposed over the surface of the substrate; and
a third semiconductor layer disposed between the substrate and the first insulator layer.

32. The apparatus of claim 31 wherein the third semiconductor layer is disposed between the substrate and the second insulator.

33. The apparatus of claim 31, further comprising an electrical contact coupled to the third semiconductor layer.

34. The apparatus of claim 21, further comprising:
a substrate;
wherein the cavity is disposed in the substrate; and
wherein the circuit component is disposed over the substrate.

35. The apparatus of claim 21, further comprising:
a substrate;
wherein the cavity includes an insulator-lined trench disposed in the substrate; and
wherein the circuit component is disposed over the substrate.

36. The apparatus of claim 21 wherein the first semiconductor layer includes a piezo-resistive material.

37. The apparatus of claim 21, further comprising a microfluidic opening in the first semiconductor layer over the cavity opening.

38. The apparatus of claim 21 wherein the first section includes an insulator layer disposed over the first semiconductor layer.

39. The apparatus of claim 21 wherein the second section includes an insulator layer disposed over the second semiconductor layer.

40. The apparatus of claim 21, further comprising an insulator layer disposed over the first and second semiconductor layers.

41. The apparatus of claim 21 wherein the circuit component comprises a thin-film transistor.

42. A system, comprising:
a first integrated circuit, including
a first section including,
a cavity having an opening, and
a first piezo-resistive semiconductor layer disposed over the opening; and
a second section including
a second semiconductor layer, and
a circuit component disposed in the second semiconductor layer; and
a second integrated circuit coupled to the first integrated circuit.

43. The system of claim 42 wherein the first and second integrated circuits are disposed on a same die.

44. A system, comprising:
a first integrated circuit, including
  a first section including,
    a cavity having an opening, and
    a first semiconductor layer disposed over the opening; and
  a second section including
    a second semiconductor layer, and
    a circuit component disposed in the second semiconductor layer; and
a second integrated circuit coupled to the first integrated circuit;
wherein the first and second integrated circuits are disposed on respective dies.

45. The system of claim 42 wherein one of the first and second integrated circuits comprises a controller.

46. The system of claim 42 wherein the first integrated circuit comprises a fluid analyzer.

* * * * *